United States Patent [19]

Cobaugh et al.

[11] 4,133,592
[45] Jan. 9, 1979

[54] STACKED PRINTED CIRCUIT BOARDS AND CIRCUIT BOARD SYSTEM

[75] Inventors: Robert F. Cobaugh, Elizabethtown; Edward C. Dowling, Harrisburg; Attalee S. Taylor, Palmyra, all of Pa.

[73] Assignee: AMP Incorporated, Harrisburg, Pa.

[21] Appl. No.: 811,010

[22] Filed: Jun. 29, 1977

Related U.S. Application Data

[63] Continuation of Ser. No. 630,859, Nov. 11, 1975, abandoned.

[51] Int. Cl.² ............................................. H05K 1/08
[52] U.S. Cl. ........................... 339/17 M; 339/17 LC; 339/75 MP; 339/176 MP
[58] Field of Search .... 339/176 LM, 176 M, 176 LC, 339/75 MP, 176 MP

[56] References Cited

U.S. PATENT DOCUMENTS

| | | | |
|---|---|---|---|
| 3,744,005 | 7/1973 | Sitzler | 339/75 MP |
| 3,868,162 | 2/1975 | Ammon | 339/17 M |
| 3,904,934 | 9/1975 | Martin | 339/17 M X |
| 4,050,758 | 9/1977 | Curley | 339/176 M X |

Primary Examiner—Roy Lake
Assistant Examiner—E. F. Desmond
Attorney, Agent, or Firm—AMP Incorporated

[57] ABSTRACT

The disclosure relates to electrical connectors positioned between adjacent printed circuit boards for interconnection therebetween. The terminal arrangements on each printed circuit board are predesigned for compatibility with the connector to be used.

In accordance with the first embodiment of the connector, a zero insertion force connector is positioned over outwardly extending pins from the printed circuit boards and is then locked to the pins by a camming action within the connector. In accordance with the second embodiment, the connector is formed in male and female halves, contact to the board by the connector being by means of a normal force engagement against pads on the printed circuit board. Extensions of lines to further adjacent printed circuit boards is provided by way of additional connectors of the same type mounted in the same manner. Circuits are continued by means of plated through apertures or the like in the printed circuit board to interconnect pads on opposite sides of the printed circuit board.

19 Claims, 11 Drawing Figures

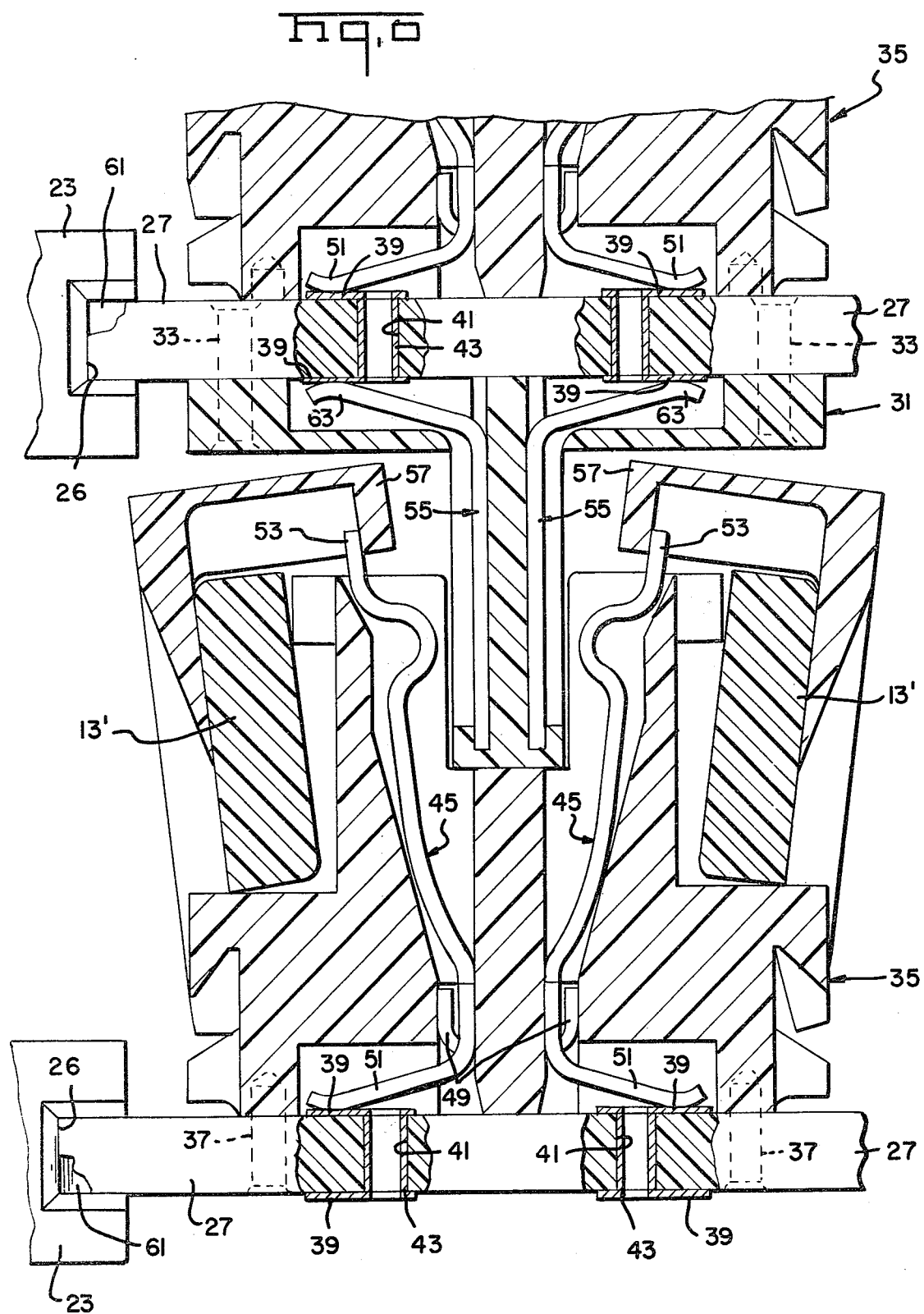

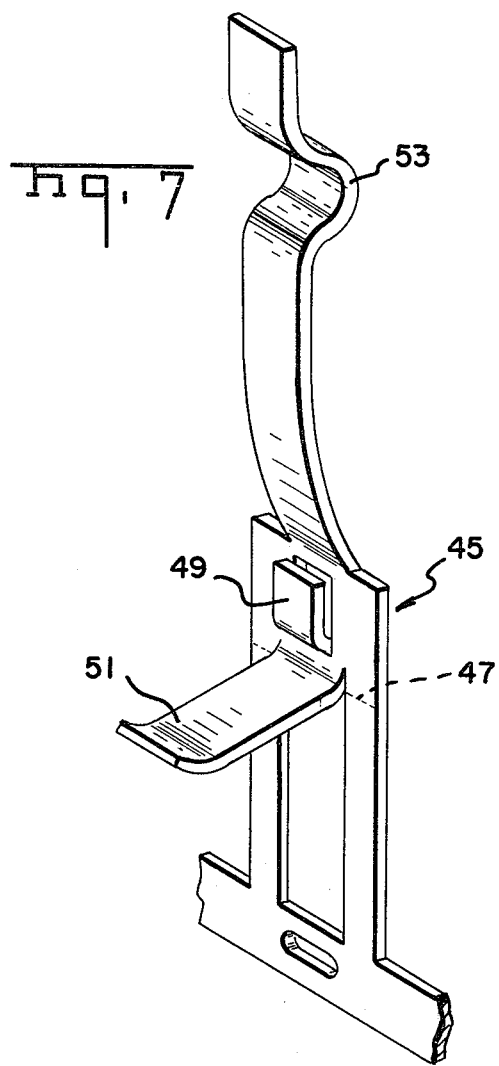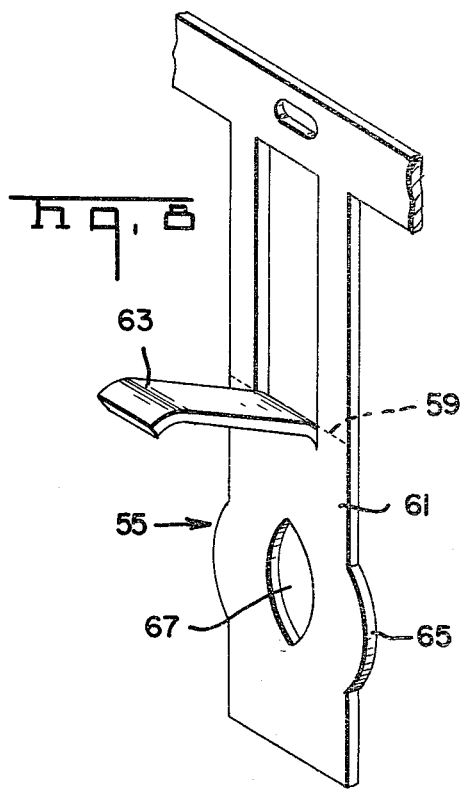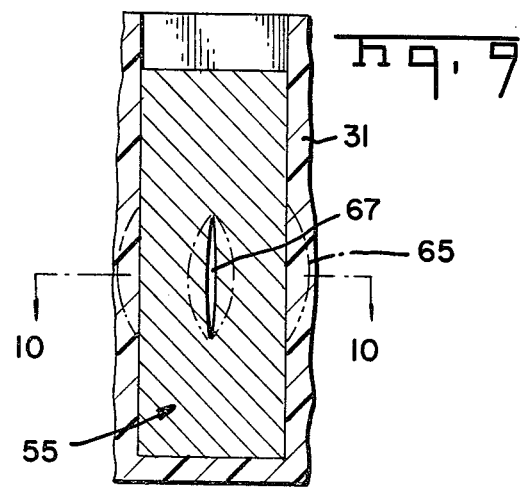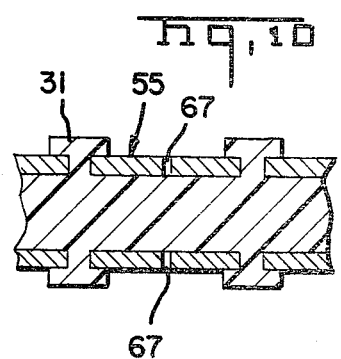

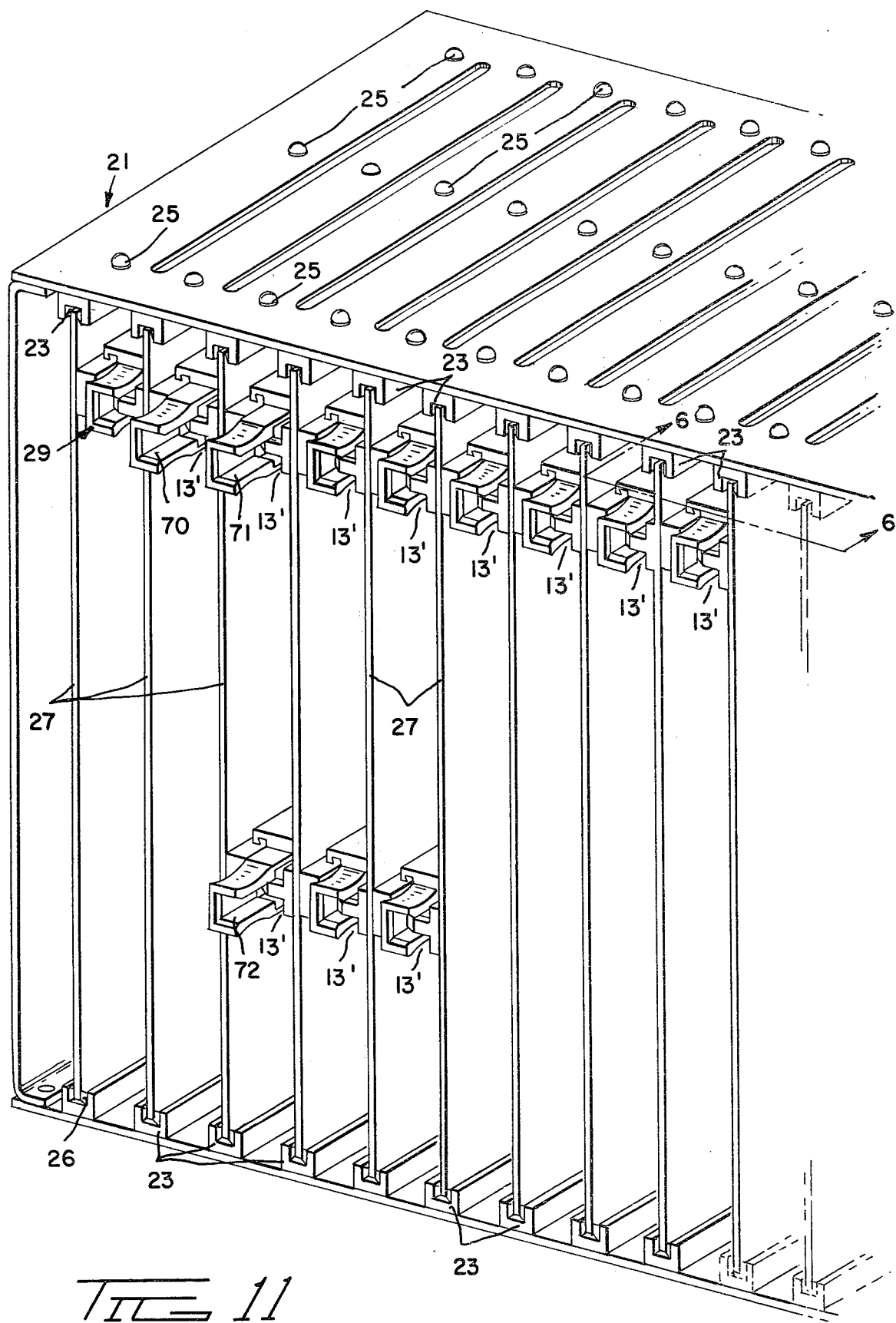

STACKED PRINTED CIRCUIT BOARDS AND CIRCUIT BOARD SYSTEM

CROSS-REFERENCE TO RELATED APPLICATION

This application is a continuation of application Ser. No. 630,859 filed Nov. 11, 1975, now abandoned by Robert Franklin Cobaugh, Edward Camp Dowling and Attalee Snarr Taylor entitled "*Stacked Printed Circuit Boards And Circuit Board System*".

FIELD OF THE INVENTION

This invention relates to electrical connectors for interconnecting printed circuit boards to form a stacked printed circuit system, and more specifically, to a printed circuit board sytem wherein electrical connectors interconnecting adjacent printed circuit boards are disposed between the adjacent boards and provide the unique number of interconnections required between two adjacent boards.

DESCRIPTION OF PRIOR ART

Several systems for interconnecting printed circuit board systems (i.e. three or more printed circuit boards) as well as supplying thereto required electrical signals and power sources are known in the art. In accordance with a first system, which will be called unique point to point back plane interconnection, interconnection is provided uniquely from each point on a printed circuit board in the system to a unique point or points on other printed circuit boards in the system. This can be accomplished by direct wiring from point to point. While this system can be substantially one hundred percent efficient in the use of available interconnections, it is rigid and inflexible. Furthermore, since the number of connections between boards can vary from board to board, it is necessary to use connectors between boards having different numbers of terminals for each connector, thereby requiring a very large inventory or, on the other hand, utilizing the same connector between boards with concomitant loss in terminal efficiency.

A second system will be called herein bus wiring with back plane. In accordance with this system, each of the printed circuit boards is connected to a back plane, composed of edge connectors or equivalent, the back plane having a unique connector position for each unique signal utilized in the entire system. It can therefore be seen that as the systems increase in complexity, the number of connector positions in each back plane will become immense. While a system of this type has maximum flexibility in that printed circuit boards can be added to the system ad infinitum as long as all of the necessary signal lines are present, the number of connector positions utilized has statistically been found to be extremely low. Therefore, the increase in flexibility is provided as a trade off to efficiency and therefore to cost. It is therefore readily apparent that the interconnection systems between printed circuit boards in printed circuit board systems has obtained efficiency at the expense of flexibility or flexibility at the expense of efficiency.

SUMMARY OF THE INVENTION

In accordance with the present invention, the above noted problems of the prior art are substantially overcome and there is provided a system which provides the desired flexibility in conjunction with a substantial increase in connector terminal efficiency use, thereby providing the best of both of the prior art systems. Briefly, this is accomplished by eliminating the back plane completely and providing a connector between each adjacent pair of printed circuit boards in the system. The terminals on the printed circuit boards are provided whereby signals do not pass therethrough automatically. Each signal will pass via the connector from the surface of one printed circuit board to the facing surface on the adjacent printed circuit board and terminate thereon. The signal will then be either (1) operated upon by the circuitry and (a) passed through a plated aperture to the other side of the printed circuit board, or (b) passed back through the connector, (2) passed through the printed circuit board via a plated aperture directly or (3) terminate on the printed circuit board before or after being operated upon. Signals that pass through apertures in the printed circuit board are then picked up via a further connector on the othe side of the printed circuit board and passed on in the established manner. In this manner, it can be seen that the sum total of terminals on facing sides of adjacent boards is equal to the actual number of signals passing therebetween. It is merely necessary that the printed circuit boards be arranged so that the same signal, whether passed directly through or worked upon before being passed through continue along the same path. This is merely a matter of printed circuit board design which is well known in the art. In this manner, the system can be expanded ad infinitum by merely adding additional printed circuit cards with the appropriate connectors in the same manner as in the bus wiring back plane system of the prior art as indicated above. However, the number of terminals required between adjacent printed circuit boards is materially reduced to only that unique number of signals passing between printed circuit boards.

Two embodiments of the above interconnection system are disclosed. In accordance with the first embodiment, zero insertion force connectors of the prior art are utilized by interconnection to pins formed in the printed circuit boards and extended outwardly therefrom. Such a zero insertion force connector is set forth in application Ser. No. 560,856 of Robert F. Cobaugh et al., filed Mar. 21, 1975. These connectors are designed to receive pins or terminal pads at both sides thereof and therefore can be connected to the terminals of two adjacent sides of adjacent printed circuit cards. By expanding the system in a stacked manner, a complete printed circuit board system is provided utilizing the concepts as described hereinabove.

In accordance with the second embodiment, the pins on the printed circuit boards are replaced by pads on both sides of the printed circuit board which can be interconnected by a plated through aperture therebetween, when necessary. Each connector is formed in male and female halves, so that, upon proper operation of the camming mechanism therein, a board can be moved sidewise out of the system or entered into the system, as desired.

It is therefore an object of this invention to provide a new system for printed circuit card-to-card interconnection.

It is a further object of this invention to provide a printed circuit card-to-card interconnection system having low cost and maximum flexibility.

It is a yet further object of this invention to provide an interconnection system for printed circuit cards utilizing minimum connector positions between cards and retaining maximum expandability of the system.

It is yet a further object of this invention to provide an interconnection system for printed circuit card systems wherein the interconnections are made between adjacent cards with elimination of back plane and edge connectors.

It is yet a further object of this invention to provide an interconnection system for printed circuit cards which optimizes the minimum distance of interconnect lines, thus providing relatively higher speed signal transfers.

The above objects and still further objects of the invention will immediately become apparent to those skilled in the art after consideration of the following preferred embodiments thereof, which are provided by way of example and not by way of limitation wherein:

BRIEF DESCRIPTION OF THE DRAWINGS

FIG. 3 is a view taken along the line 3—3 of FIG. 2;

FIG. 6 is a view taken along the line 6—6 of FIG. 11;

FIG. 8 is a perspective view of the contact 55;

FIG. 9 is a sectional view of the contact of FIG. 8 after insertion into the housing 31;

FIG. 10 is a view taken along the line 10—10 of FIG. 9; and

FIG. 11 is a perspective view of a printed circuit board system in accordance with a second embodiment of the invention.

DETAILED DESCRIPTION

Figure 1:
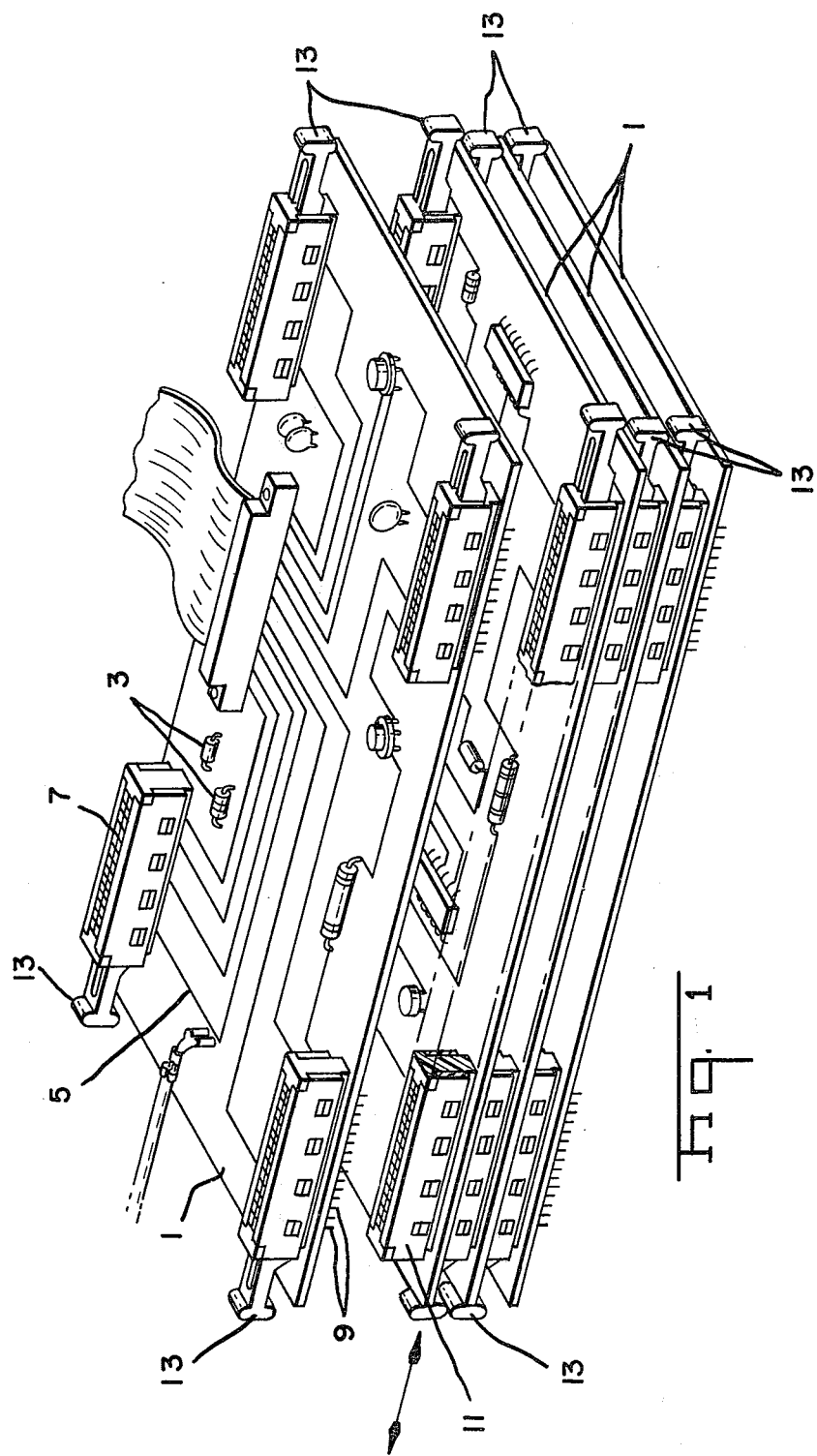
FIG. 1 is a perspective view of a printed circuit board system in accordance with a first embodiment of the invention.
Figure 2:
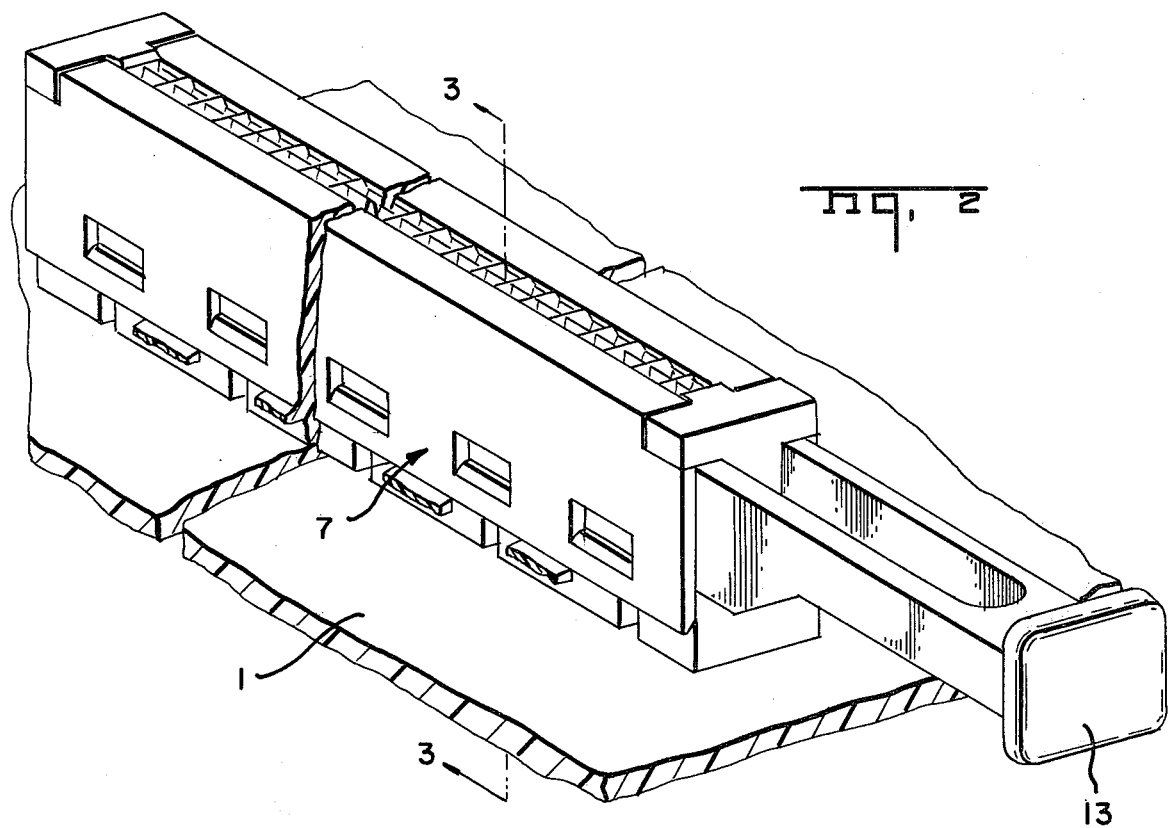
FIG. 2 is a perspective view of an electrical connector used in accordance with the present invention.
Figure 4:
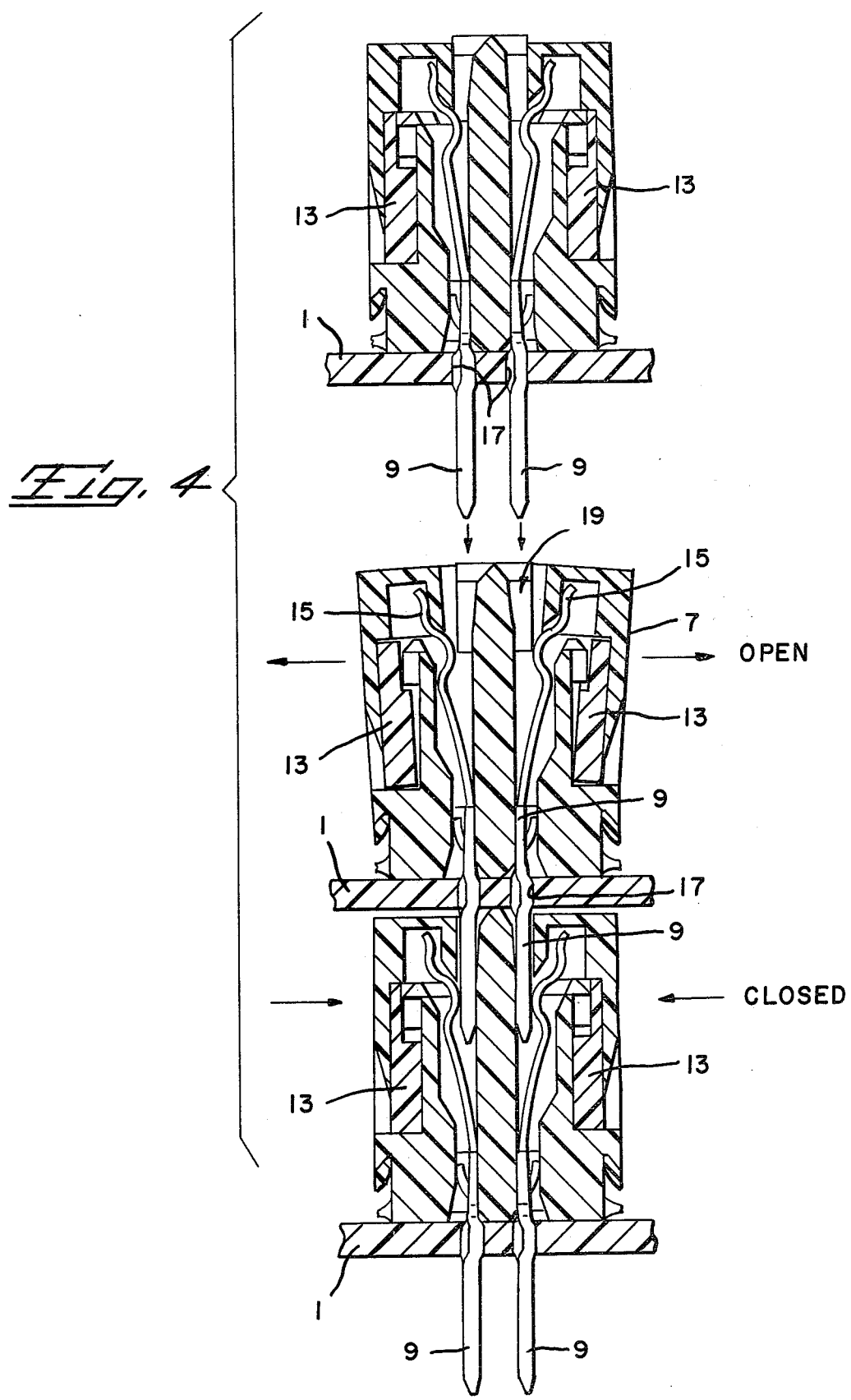
FIG. 4 is an exploded view in section of a printed circuit board in accordance with the embodiment of FIG. 1.

Referring now to FIG. 1, there is shown a perspective view of a printed circuit board system in accordance with the first embodiment of the invention. The system includes printed circuit boards 1 having electrical components 3 thereon on one surface thereof and wiring patterns 5. It should be understood that the printed circuit boards will normally have wiring patterns 5 on both sides thereof with interconnection between patterns, when required, taking place either through plated through apertures or by means of pins soldered to the wiring system 5 on both sides of the card. For the purpose of discussion herein, it will be assumed that plated through interconnection is provided. Interconnecting pins 9 are provided on both sides of the printed circuit boards 1 as shown in FIG. 4 for connection to connectors 7. The connectors can be short as shown at 7 or can extend substantially the entire length of the card as shown at 11. The electrical connectors 7 and 11 are of the zero insertion force type as described in said copending application Ser. No. 560,856 of Robert F. Cobaugh et al., filed Mar. 21, 1975. The lever 13 of the connectors 7 and 11 is movable along the axis of the connector to operate a cam which forces the contacts 15 to the open and/or closed position as shown in FIG. 4. The operation of this camming system is disclosed in the above noted copending application. The contacts 15 are formed at the upper end of pins 9 which extend through the printed circuit board apertures 17 and lock therein in well known manner. This locking of the pin 9 in the aperture 17 causes the connector 7 to be secured to the printed circuit board 1. The pins 9 can, alternatively be soldered to the board 1. Printed circuit boards can be stacked, one upon the other, by opening a connector 7 as shown in FIG. 4, positioning a printed circuit board thereover with the pins 9 entering into the apertures 19. The pins 9 are then secured within the apertures 19 when the lever 13 is placed in the closed position as shown in FIG. 4 or by movement of lever 13 inwardly as shown in FIG. 1. In this way, printed circuit boards can be stacked one to the other to provide the system as shown in FIG. 1.

Figure 5:
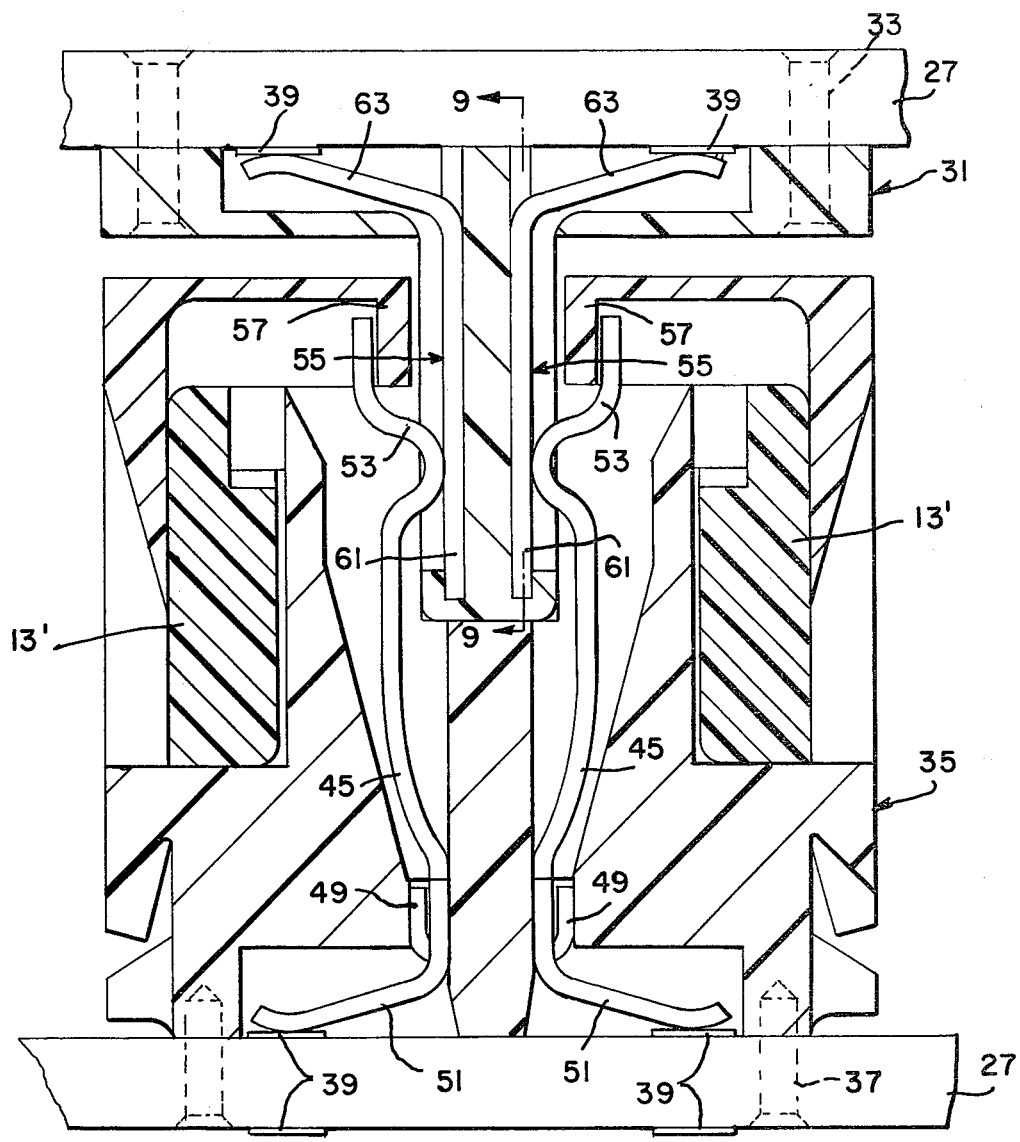
FIG. 5 is a sectional view of a second embodiment of electrical connector in accordance with the present invention.

Referring now to FIG. 11 there is shown a second embodiment of a printed circuit board system using the interconnection concepts of the present invention. There is shown a housing 21 having printed circuit card retainers or guides 23 on opposing sides therein secured to the housing 21 by means of screws 25 or other means. Printed circuit cards 27 are positioned within grooves 26 in the retainers 23 with electrical connectors 29 secured thereto. It should be understood that through the electrical connectors are shown secured to the printed circuit boards herein, it is merely necessary that these connectors be positioned between adjacent printed circuit boards. These connectors could therefore be connected elsewhere, such as, for example, to the housing 21 or the retainers 23 in which cases the connectors would be disposed adjacent a card edge. Each of the connectors includes a male and female portion, the male portion 31, as shown in FIG. 5, being secured to a printed circuit board 27 by means of rivets 33 or the like and female portion 35 being secured to an adjacent printed circuit board 27 by means of rivets 37 or the like. Each printed circuit board includes pads 39 for making electrical contact with the connector contact members which will be described in more detail hereinbelow.

Figure 7:
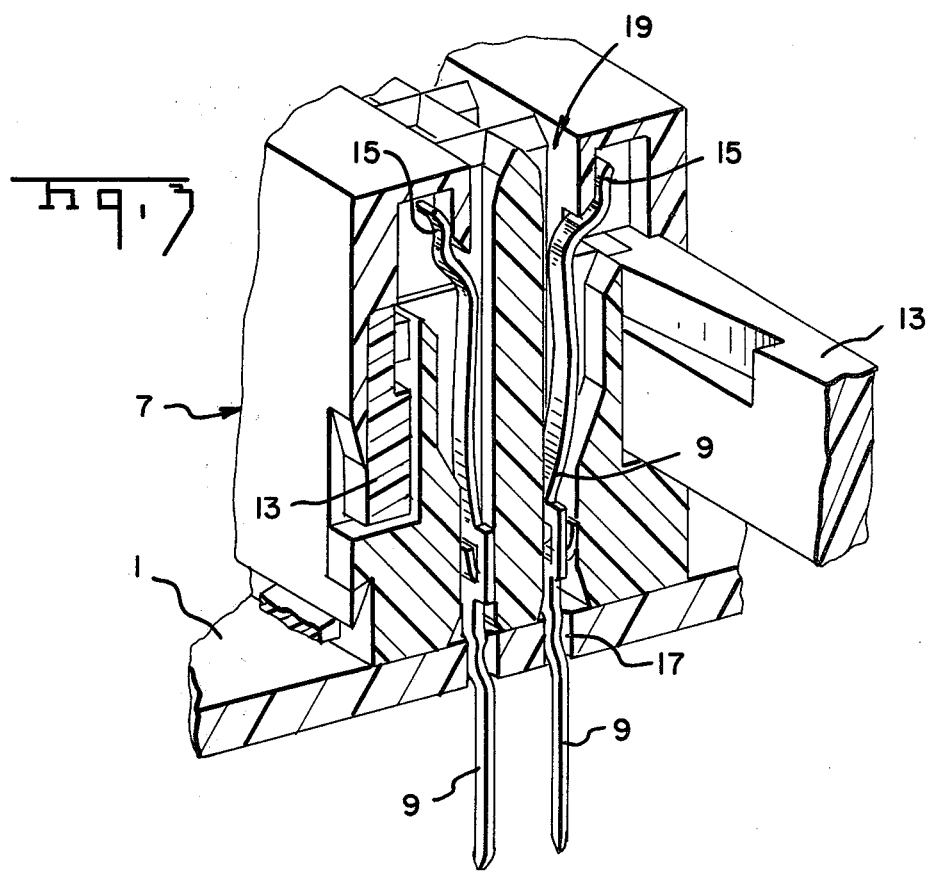
FIG. 7 is a perspective view of the contact 45.

As shown in FIG. 6 the printed circuit boards 27 can include apertures 41 through which plating material 43 interconnecting pads 39 will be positioned in those cases where it is desired to interconnect pads on both sides of the printed circuit board 27. The contacts 45, positioned in the female portion 35 of the connector are shown in detail in FIG. 7 wherein the portion below the dotted line 47 is removed before or after insertion in the connector. The pin is locked into the female connector housing 43 by means of the tine 49 which provides a frictional contact retention within the housing. The contact portions 51 and 53 are resilient and therefore provide a spring action. The portion 51 is electrically coupled to the pad 39 associated therewith as shown in FIG. 5 whereas the portion 53 is designed to normally make contact with the contact 55 of the male portion 31 as shown in FIG. 5. Movement of the lever 13' (FIG. 11) outwardly will cause the flange 57 of the connector portion 35 to abut the contact portion 53 and move same away from the terminal 55, thereby removing any force between contacts 53 and 55. The contact 55 is disposed in the male housing portion 31 and is better shown in FIG. 8. The portion above the dotted line 59 in FIG. 8 is removed prior to or after insertion into the male housing 31. The portion 61 of the contact 55 is rigidly secured within the male housing 31 to provide a compressive friction fit and the portion 63 is flexible and contacts the pad 39 on the upper printed circuit card 27 as shown in FIG. 5. The locking of the terminal 55 into the male housing 31 is best illustrated in FIGS. 9 and 10 wherein, when the rounded portion 65 of the terminal 55 is forced into the housing, the rounded portion is moved inwardly towards the aperture 67 to partially fill the aperture 67 as shown in FIG. 9 to lock the contact into the housing. The cross section of the contact locked in the housing is shown in FIG. 10.

Referring now to FIGS. 6 and 11, the operation of the present interconnection system will be explained in detail. Each printed circuit board will have secured thereto a male housing portion 31 and a female housing portion 35. The male housing portion 31 will be positioned on one side of the printed circuit board 27 and the female housing portion 35 on the other side so that it can be seen that the two housing portions actually are portions of different connectors. A printed circuit board 27 is positioned within the grooves 26 of guides 23 (FIG. 11) and moved rearwardly until it reaches a stop 61 (FIG. 6) at which point the board 27 will be properly positioned to align mating pads 39 on adjacent boards. The locations of the stops 61 are critical since they provide for proper alignment between male and female portions of a single connector. Also, if desired, high current busses can be placed in the card retainers 23 for connection to the printed circuit board rather than having such high current signals pass through the connectors themselves. A printed circuit board 27 is inserted and/or removed from the housing 21 by outward movement of selected ones of levers 13'. More specifically, the levers 13' on both sides of a printed circuit board to be removed must be moved outwardly in order for printed circuit board to be releaseable. Thus, the three connector levers 13' attached to the pull knobs 70, 71 and 72 are shown in their outward position so that the male and female portions of the connectors of which they are a part are in an unmated condition, thereby permitting withdrawal of the card 27 therebetween. The remaining camming levers 13' are shown in their inward or closed position so that the male and female parts of the connectors of which they are a part are mated and the cards 27 therebetween cannot be withdrawn. As discussed briefly above re FIG. 6, movement of a lever 13' outwardly causes the terminals 53 to move away from the terminals 55 to provide a zero force thereon. In this manner, no force is placed on the male or female connector member on either side of the printed circuit board 27 and the board can then be pulled outwardly along the channel or moved inwardly along the channel without any impediment placed in the paths of the connector portions.

In the embodiment shown in FIGS. 5 to 11, the connector portion 35 will have no impediments along its axial path of travel when mating with connector portion 31 and vice versa. Furthermore, there will be a small space between connector portion 31 and portion 35 in the mating regions so that no force is applied by one connector portion against the other connector portion during insertion or removal of a card 27. In this manner, printed circuit boards can be added or withdrawn from the housing with relative ease. This makes it very simple to expand or contract or interchange printed circuit boards in the system.

It should be further noted that in those cases wherein a signal terminates on one side of a printed circuit card, the same terminal position can be used on subsequent cards for other signals since the terminated signal would end on a pad 39 which is not connected to pads on the reverse side of the card.

It should also be noted that pads 39 can be staggered on cards or placed in different locations for different signal groupings so that interconnection cannot be made to two adjacent cards which would be erroneous. This would also provide an inherent keying system.

In view of the expandability and interchangeability of the printed circuit boards, it can be seen that any types of terminating devices can be placed anywhere in the system or at the end of the system and that connection between printed circuit boards is possible with any type of interchange so long as judicious assignment is made to the signals to be passed to the various terminal positions so that signals can traverse the desired path from board to board regardless of the locations of the particular boards.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A printed circuit board system comprising:
   at least three parallel spaced printed circuit boards having conductive contact receiving means positioned on both surfaces of each board, predetermined ones of said contact receiving means on one side of a board being electrically connected to said contact receiving means on the other side of the same board by means of a conductor positioned in an aperture passing through said board,
   electrical connector means positionable back-to-back between adjacent boards and contacting said contact receiving means on corresponding facing surfaces of adjacent boards, and
   wherein preselected ones of said contact receiving means on both sides of a given board and the facing sides of each board adjacent said given board lay along straight lines which are normal to the planes of said boards, and electrically conductive means releasably interconnecting said back-to-back electrical connector means to enable the continuation of selected circuit paths through or to three or more boards through said electrical connector means positioned back-to-back with respect to each other and positioned between adjacent boards.

2. A printed circuit board system as in claim 1 wherein each of said electrical connectors means comprises matable male and female portions, said male portion comprising first contacts electrically connected to said contact receiving means on the surface of one said board and said female portion comprising second contacts electrically connected to said contact receiving means on the facing side of the adjacent board, said male and female portions being releasably mechanically mated and said first and second contacts being releasably electrically mated to comprise said electrically conductive means.

3. A printed circuit board system as in claim 1 wherein said contact receiving means are conductive pads formed on said printed circuit boards.

4. A printed circuit board system as recited in claim 3 wherein each of said electrical connector means comprises matable male and female portions, each said male portion comprising first contacts electrically connected to said contact receiving means on the surface of one said board and each said female portion comprising second contacts electrically connected to said contact receiving means on the facing side of the adjacent board, said first and second contacts releasably engaging to provide said electrically conductive means.

5. A printed circuit board system as recited in claim 2 wherein said female portion includes a groove extending axially the entire length thereof and said male portion includes a flange matable with said groove and extending axially the entire length thereof whereby one each of said male and female portions can merge with the other by movement of one relative to the other axially along said groove and flange.

6. A printed circuit board system as recited in claim 4 wherein said female portion includes a groove extending axially the entire length thereof and said male portion includes a flange matable with said groove and extending axially the entire length thereof whereby one of said male and one of said female portions can merge with the other by movement of one relative to the other axially along said groove and flange.

7. A printed circuit board system as recited in claim 2 and further comprising camming means in a first position for separating said first and second contacts to enable mating or separation of said male and female portions with low engagement and separation forces, and in a second position for engaging said first and second contacts when said male and female portions are mated.

8. An electrical connector for connecting together at least two parallel spaced circuit boards and which comprises:
- a male portion,
- a female portion matable with said male portion,
- said male portion being substantially T-shaped with the head of said T secured to one of said circuit boards and a flange, said flange extending axially the entire length thereof and first contact members positioned along both sides of said flange and extending to the head of said T,
- said female portion including an axial groove for receiving said flange in an axial direction and a portion on the side opposite said groove secured to the other of said circuit boards and second contact members therein extending to said portion and releasably engageable with said contacts in said male portion, and
- camming means in said female member for moving said second contact members therein against and away from said first contact members in said male member to provide an engaged and a non-engaged condition between said male and female portions.

9. An electrical connector as recited in claim 8 wherein space is provided between the walls of said groove axially thereof and said flange axially thereof, whereby there are no impediments when said flange is moved axially along the entire length of said groove.

10. The combination of a plurality of printed circuit boards stacked in parallel with each other in a predetermined alignment and connector means interconnecting said printed circuit boards and comprising:
- a plurality of first contact receiving means arranged in a first pattern on a first side of a first printed circuit board with some of said first contact receiving means comprising conductive areas and others of said contact receiving means comprising apertures extending through said first printed circuit board;
- a plurality of second contact receiving means arranged in a second pattern on the second side of said first board, at least in part coincident with said first pattern of said contact receiving means on the first side of said first board;
- first and second adjacent boards positioned on said first and second sides of said first boards, each with a plurality of contact receiving positions positioned opposite at least a portion of the contact receiving means on the corresponding first and second sides of said first board respectively;
- male connector means, some secured to said first side of said first board and some to the facing side of said second adjacent board, with said male connector means comprising a plurality of two ended first contacts, some electrically connected at first ends thereof to said plurality of contact receiving means on the first side of said first board and some to the facing side of said second adjacent board, respectively, and with second ends on said first contacts extending outwardly towards said first adjacent board and said first board, respectively;
- first and second female connector means, some secured to the second side of said first board and some to the facing side of said first adjacent board, with said female connector means comprising a plurality of two ended second contacts, some electrically connected at first ends to said plurality of contact receiving means on the second side of said first board and some to said first adjacent board, respectively, and with second ends of said second contacts extending outwardly towards and matable with the first contacts of said male connector means secured on said second adjacent board and said first board respectively;
- each of said female connector means comprising housing means for receiving and mating with said first contacts of the facing male connector means; and
- camming means for engaging and disengaging the mating first and second contacts of said male and female connector means during the engagement and disengagement of said male and female connector means; and
- said oppositely positioned contact receiving means on facing surfaces of each adjacent pair of said printed circuit boards are coincident in lines extending in directions normal to the planes of said printed circuit boards.

11. A combination as recited in claim 10 in which:
- the plurality of first contacts of said first and second male connector means are arranged in at least one row in each of said male connector means with the first ends of said first contacts pressed against the respective conductive areas of the first side of said first board and the facing side of said second adjacent board, without extending through said boards;
- the plurality of second contacts of said first and second female connector means are arranged in at least one row in each of said female connector means with the first ends of said second contacts pressed against the contact receiving positions of the second side of said first board and the facing side of the first adjacent board without extending through said boards; and said housing means of each of said female connector means has an open-ended, elongated slot formed alongside said row of second contacts to enable engagement and disengagement of corresponding said male and female connector means along said elongated slot when said first and second contacts are disengaged.

12. A combination as recited in claim 10 in which:

the first contacts of said male connector means comprises a plurality of terminal posts extending perpendicularly from the contact receiving means on a first side of a respective board, and said second contacts of said female connector means each is integrally connected to one of said terminal posts through an aperture in said respective board and outwardly extends from the second side of said respective board to form one of said second contacts contained within a female connector means mounted on the second side of said first board;

the terminal posts extending from a first side of a respective board matable with the female connector means are secured to the surface of an adjacent board facing said first side of said first board; and conductive areas and plated through holes being selectively formed at the contact receiving positions of a respective board to selectively connect the first and second contacts of said male and female connector means to circuit paths on either side of said respective board.

13. In combination, a plurality of printed circuit boards stacked in predetermined parallel positions relative with each other and having, conductive areas formed in selected ones of a given pattern of positions on said printed circuit boards, and plated through holes formed in selected other ones of said given pattern of positions, and connector means for interconnecting conductive areas on adjacent pairs of printed circuit boards comprising:

a plurality of male contacts arranged to make contact with said conductive areas and said plated through holes in said given pattern of positions on a first side of a first of a given pair of adjacent printed circuit boards, and a plurality of female contacts arranged to receive said male contacts, when said adjacent pair of boards are arranged in their predetermined positions, and also to connect said male contacts to the conductive areas and the plated through holes on a first surface of the second and said first pair of adjacent boards;

at least a portion of the pattern of male contacts between said pair of adjacent printed circuit boards being in coincident alignment with at least a portion of the pattern of female contacts extending away from the second side of said first board; and at least a portion of the pattern of female contacts between said pair of adjacent printed circuit boards being coincident with at least a portion of the pattern of male contacts extending away from the second side of said second board.

14. In combination, at least a first, a second and a third circuit board, each having contact receiving areas and being arranged in a stacked, parallel manner and spaced apart from each other a predetermined distance, with first connector means interconnected between contact receiving areas on both said first and said second boards and second connector means interconnected between contact receiving areas on both said second and third boards;

said first and second connector means each comprising at least one male connector portion with first contacts arranged in a predetermined pattern and at least one mating female connector portion with second contacts arranged in a predetermined pattern and constructed to receive individual ones of said first contacts;

the pattern of said first contacts between said first and second printed circuit boards being coincidental with at least a portion of the pattern of said first contacts between said second and third boards in a direction normal to the plane of said boards;

the pattern of said second contacts between said first and second boards being coincidental with at least a portion of the pattern of said second contacts between said second and third boards in a direction normal to the plane of said boards; and the second contacts of each said female connector portion between a given pair of adjacent printed circuit boards being constructed and positioned to receive and retain in contact therewith the said first contacts of a corresponding said male connector portion positioned between said given pair of adjacent printed circuit boards; and each of said female connector portions further comprising an insulative housing means enclosing said second contacts.

15. A combination as in claim 14 in which:

the first contacts of each of said male connector portions each has two ends arranged in at least one row with their first ends pressed against the contact receiving areas of a first side of a given board without extending therethrough, and the second ends of said first contacts extend towards the facing side of an adjacent board;

the second contacts of each of said female connector portions each has two ends arranged in at least one row with their first ends pressed against the contact receiving areas of the side of one said adjacent board facing the first side of said given board, and the other ends of said plurality of second contacts extend towards, and are matable with, the plurality of the first contacts of a corresponding said male connector portion extending from the first side of said board;

said insulative housing means of said female connector portion has an open ended, elongated slot formed therein alongside said row of second contacts, and said insulative housing means further comprises camming means for moving said plurality of second contacts out of the path of said plurality of first contacts to enable engagement and disengagement of said male and female connector portions along said elongated slot.

16. A combination as in claim 14 in which:

the first contacts of said male connector portion comprises a plurality of terminal posts extending perpendicularly from the contact receiving areas on a first side of a given board, and said second contacts of said female connector portion are each integrally connected to one of said terminal posts through an aperture in said given board and extend outwardly from the second side of said given board to form one of the contacts contained within a female connector portion positioned adjacent the second side of said first board;

the terminal posts extending from a first side of a board being matable with the female connector portion positioned adjacent the surface of an adjacent board facing said first side of said first board; and conductive areas and plated through holes being selectively formed at the contact receiving areas of a given board to selectively connect the contacts of corresponding said male and female connector portions to circuit paths on either side of said given board.

17. In combination with at least three circuit boards each having contact receiving areas and arranged in a stacked manner in parallel with each other and spaced apart a predetermined distance by first connector means positioned between first and second boards and second connector means positioned between said second and third boards;

said first and second connector means each comprising:

a male connector portion comprising first contacts positioned between facing sides of a pair of adjacent circuit boards and arranged to make contact with contact receiving areas forming a first predetermined pattern on the facing side of one of said adjacent circuit boards; and a female connector portion comprising housing means and second contacts contained therein which are arranged to make contact with contact receiving areas forming a predetermined pattern on the facing side of the other one of said adjacent circuit boards;

a pattern said first contacts make with said one circuit board being coincident with at least a portion of a pattern said second contacts make with the other one of said circuit boards in a direction normal to the plane of said circuit boards;

said female connector portion between said pair of adjacent circuit boards being constructed to receive, and retain in contact with said second contacts, those first contacts arranged in said coincident portion of said predetermined pattern of said first and second contacts between said pair of adjacent circuit boards;

said female connector portion further comprising camming means construced to disengage said second contacts from said first contacts during insertion and withdrawal of said first contacts from said female connector portion to enable zero insertion and withdrawal force of said first contacts from said female connector portion.

18. A combination as in claim 17 in which:

the plurality of first contacts of said male connector portions have two ends and are arranged in at least one row with first ends thereof being pressed against contact receiving positions of a first side of a given board without extending therethrough, and the second ends of said plurality of first contacts extend towards the facing side of an adjacent board;

said second contacts of the female connector portions on the facing side of each said adjacent board have two ends and are arranged in at least one row, with first ends thereof being pressed against the contact receiving positions of the facing side of said adjacent board and with the other ends thereof extending towards and matable with the ends of the plurality of the first contacts of said male connector portions extending from the first side of said given board; and said housing means of each said female connector portion has an open ended slot formed therein alongside said row of second contacts to enable engagement and disengagement of said male and female connector portions along said elongated slot when said camming means disengages said second contacts from said first contacts.

19. A combination as in claim 17 in which:

the first contacts of said male connector portions comprise a plurality of terminal posts extending perpendicularly from the contact receiving positions on a first side of a given board; and said second contacts of said female connector portions are each integrally connected to one of said terminal posts projecting through an aperture in said given board, and extend outwardly from the second side of said given board to form one of the contacts contained within a female connector portion mounted on the second side of said first board;

the terminal posts extending from a first side of a board being matable with the female connector portion which is secured to the surface of an adjacent board facing said first side of said first board; and conductive areas and plated through holes being selectively formed at the contact receiving positions of said given board to selectively connect the contacts of male and female connector portions to circuit paths on both sides of said given board.

* * * * *